(12) United States Patent
Der et al.

(10) Patent No.: US 7,587,184 B2
(45) Date of Patent: Sep. 8, 2009

(54) CONTROLLING FINE FREQUENCY CHANGES IN AN OSCILLATOR

(75) Inventors: Lawrence Der, Austin, TX (US); Dana Taipale, Austin, TX (US); Scott Willingham, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 537 days.

(21) Appl. No.: 11/259,910

(22) Filed: Oct. 27, 2005

(65) Prior Publication Data

US 2007/0001823 A1 Jan. 4, 2007

Related U.S. Application Data

(60) Provisional application No. 60/695,320, filed on Jun. 30, 2005.

(51) Int. Cl.
*H04B 1/18* (2006.01)

(52) U.S. Cl. .............. 455/173.1; 455/182.3; 455/182.1; 331/34; 331/36 R; 327/105; 327/111

(58) Field of Classification Search ................. 455/258, 455/424, 425, 456.5, 456.6, 561, 550.1, 575.1, 455/323, 260, 73, 71, 75, 76, 125, 164.1, 455/173.1, 182.1, 183.1, 182.3, 192.2, 192.3, 455/196.1, 197.2, 197.3; 331/177 R, 36, 331/116 FE, 158, 179, 116 R, 18, 68, 14, 331/117 R, 36 R, 34, 35, 16, 7, 36 C, 17, 331/25; 327/105, 111, 149–151, 153, 158–161
See application file for complete search history.

(56) References Cited

U.S. PATENT DOCUMENTS

| | | | |
|---|---|---|---|
| 5,463,285 A | 10/1995 | El-Hamamsy | ............... 315/248 |
| 5,930,773 A * | 7/1999 | Crooks et al. | ................. 705/30 |
| 6,181,121 B1 * | 1/2001 | Kirkland et al. | ............. 323/313 |
| 6,226,506 B1 | 5/2001 | Welland et al. | ............. 455/260 |
| 6,233,441 B1 | 5/2001 | Welland | ..................... 455/260 |
| 6,304,152 B1 | 10/2001 | Takahashi | ................... 331/116 |
| 6,311,050 B1 | 10/2001 | Welland et al. | ............. 455/260 |
| 6,327,463 B1 | 12/2001 | Welland | ..................... 455/260 |
| 6,549,764 B2 | 4/2003 | Welland | ..................... 455/260 |
| 6,574,288 B1 | 6/2003 | Welland et al. | ............. 375/327 |
| 6,760,575 B2 | 7/2004 | Welland | ..................... 455/260 |

(Continued)

OTHER PUBLICATIONS

PCT/US2006/025691 International Search Report with Written Opinion of the International Searching Authority Mailed Feb. 6, 2007.

(Continued)

*Primary Examiner*—Duc Nguyen
*Assistant Examiner*—Charles Chow
(74) *Attorney, Agent, or Firm*—Trop, Pruner & Hu, P.C.

(57) ABSTRACT

In one embodiment, the present invention includes a method for determining if a frequency control instruction would cause a first capacitor bank to reach a limit and adjusting the first capacitor bank in a first direction using a calibration value and adjusting a second capacitor bank in a second direction if the first capacitor bank would reach the limit. Furthermore, the calibration value may be calculated and stored in accordance with other embodiments. In such manner, small changes in capacitance and correspondingly small changes in frequency may be effected.

11 Claims, 8 Drawing Sheets

U.S. PATENT DOCUMENTS

| | | | |
|---|---|---|---|
| 6,853,272 B1 | 2/2005 | Hughes | 334/15 |
| 6,927,637 B1 * | 8/2005 | Koh et al. | 331/17 |
| 7,336,134 B1 * | 2/2008 | Janesch et al. | 331/36 C |
| 7,417,512 B2 * | 8/2008 | Lee | 331/158 |
| 2001/0020875 A1 * | 9/2001 | Jansson | 331/44 |
| 2003/0206070 A1 * | 11/2003 | Pietruszynski et al. | 331/158 |
| 2004/0077327 A1 | 4/2004 | Lim et al. | 455/318 |
| 2004/0166815 A1 * | 8/2004 | Maligeorgos et al. | 455/73 |

OTHER PUBLICATIONS

U.S. Appl. No. 11/241,419, filed Sep. 30, 2005, entitled "Cancellation Of Undesired Portions Of Audio Signals" by Dana Taipale.

U.S. Appl. No. 11/259,888, filed Oct. 27, 2005, entitled "Method and Apparatus to Generate Small Frequency Changes" by Lawrence Der, Dana Taipale and Scott Willingham.

U.S. Appl. No. 11/226,041, filed Sep. 14, 2005, entitled "Capacitor Array Segmentation" by James P. Maligeorgos, Donald A. Kerth, Augusto M. Marques.

* cited by examiner

CONTROLLING FINE FREQUENCY CHANGES IN AN OSCILLATOR

This application claims priority to U.S. Provisional Patent Application No. 60/695,320 filed on Jun. 30, 2005 in the name of Lawrence Der, Dana Taipale, and Scott Willingham entitled METHODS AND APPARATUS TO GENERATE SMALL FREQUENCY CHANGES.

FIELD OF THE INVENTION

The present invention relates to controlling an oscillator, and more particularly to effecting frequency changes in a numerically controlled oscillator (NCO).

BACKGROUND

Typical wireless communications systems, including cellular telephones, radios, and other wireless systems communicate data at high frequencies, i.e, at radio frequency (RF). Radio frequency signals are electrical signals conveying useful information having a frequency from about 3 kilohertz (kHz) to thousands of gigahertz (GHz), regardless of the medium through which such signals are conveyed. Thus an RF signal may be transmitted through air, free space, coaxial cable, fiber optic cable, etc. To process RF signals receive circuitry of a receiver, for example, generally converts the received RF signals to one or more lower frequencies, including an intermediate frequency (IF) and a baseband frequency. As an example, in a radio tuner, a frequency corresponding to a desired radio channel is tuned by mixing an incoming RF signal spectrum with a frequency generated in a local oscillator (LO) to obtain signal information of the desired channel. In various implementations, such a LO may be a voltage controlled oscillator or an NCO, such as a digitally controlled oscillator (DCO).

A VCO is typically included in a phase-locked loop (PLL) circuit to generate the desired LO signal based upon a feedback loop determined with reference to phase information. However, such systems often suffer from phase noise and other problems. Accordingly, some systems instead implement an NCO, which may be controlled using frequency information.

In practice, a controlled oscillator can have its frequency controlled by changing capacitance values of one or more capacitors coupled to an oscillator element, such as a resonant tank. By varying the capacitance, the frequency generated by the controlled oscillator may be correspondingly varied. To effect frequency tuning, one or more capacitor banks may be provided. Each capacitor bank may include one or more capacitors to be switched into or out of a capacitance array line to affect the total capacitance. By controlling the capacitance, the frequency of the controlled oscillator may be concomitantly controlled.

Analog control of capacitances is often effected using an analog varactor to continuously adjust capacitance values. Other implementations use a digital word to control a capacitor bank that includes an array of capacitors to be switched into or out of a capacitor array line. In practice, the range of capacitances needed to cover a given frequency range, as well as provide small enough frequency steps for proper tuning, can be difficult to design and fabricate.

Capacitor array banks are typically formed of a plurality of capacitor branches coupled in parallel between an input node (i.e., a capacitor array line) and a ground potential. In embodiments that are discretely controlled, a digital control word may include a plurality of bits, ranging from a most significant bit (MSB) to a least significant bit (LSB), each to control a respective branch of the array bank, each branch of which may have a different capacitance value. To maintain operation at a high frequency, arbitrary fixed capacitors cannot be added into a capacitor bank. The MSBs dominate the loss of the system. To have predictable changes, especially in the LSBs, there must be a similar structure across the capacitor bank. However, a similar structure for all capacitors is not easily controlled, as significant variances can exist between the large and small capacitor values. These significant variances can negatively impact performance by leading to frequency gaps within a desired range.

Accordingly, a need exists to provide for improved control of oscillators, and particularly to control of fine frequency changes in a controlled oscillator.

SUMMARY

In one aspect, the present invention includes a method for determining if a frequency control instruction would cause a first capacitor bank to reach a limit, adjusting the first capacitor bank in a first direction using a calibration value and adjusting a second capacitor bank in a second direction if the first capacitor bank would reach the limit. If however, the first capacitor bank would not reach the limit, the first capacitor bank may be adjusted in the second direction. The first capacitor bank may be calibrated to obtain the calibration value, which can be stored in a storage medium. Using calibrated capacitor banks in accordance with an embodiment of the present invention, a monotonic frequency change may be obtained for a monotonic change to a frequency control instruction in an oscillator coupled to receive an output of the first and second capacitor banks.

Yet another aspect resides in a method including determining a frequency range corresponding to a least significant bit (LSB) of a first control word that controls a first capacitor bank of a controlled oscillator, measuring a measured value of a second control word that controls a second capacitor bank of the controlled oscillator at which the second capacitor bank provides a capacitance value substantially corresponding to the frequency range, and storing the measured value of the second control word. Then, using this stored value, a frequency of the controlled oscillator may be adjusted when a limit of the second capacitor bank is reached. As one example of a frequency adjustment, the LSB of the first control word may be adjusted in a first direction and a value of the second capacitor bank may be adjusted in a second direction based on the measured value.

Still further, a system may be provided that includes a mixer to receive a radio frequency (RF) signal and to provide an intermediate frequency (IF) signal according to a mixing signal, and a controlled oscillator to generate the mixing signal. The controlled oscillator may include a load capacitor formed of first and second capacitor banks with different weighting schemes and a controller to control the load capacitor, where the controller is to determine a value of the second capacitor bank corresponding to a frequency range of a smallest controllable portion of the first capacitor bank. In one implementation, at least the second capacitor bank may include a branch having a first capacitor coupled between a first node and a second node, a second capacitor coupled between the second node and a reference potential, and a third capacitor coupled between the second node and a switch, where the switch is to electrically couple the third capacitor to the second node under control of the controller. In some implementations, the controller may be implemented in a digital signal processor (DSP) that may be integrated on a single substrate with the mixer and the controlled oscillator.

Applications for methods and apparatus in accordance with an embodiment of the present invention are numerous. As one example, an integrated terrestrial audio broadcast receiver may use the capacitors and methods. The receiver may be used in a portable device having an integrated terrestrial audio broadcast receiver. The portable device, which may be a digital media player, such as an MP3 player, can include the ability to receive a wide variety of audio broadcasts, including AM spectrum and FM spectrum signals.

BRIEF DESCRIPTION OF THE DRAWINGS

FIG. 10 is a block diagram of a radio tuner in accordance with one embodiment of the present invention.

DETAILED DESCRIPTION

Figure 1:
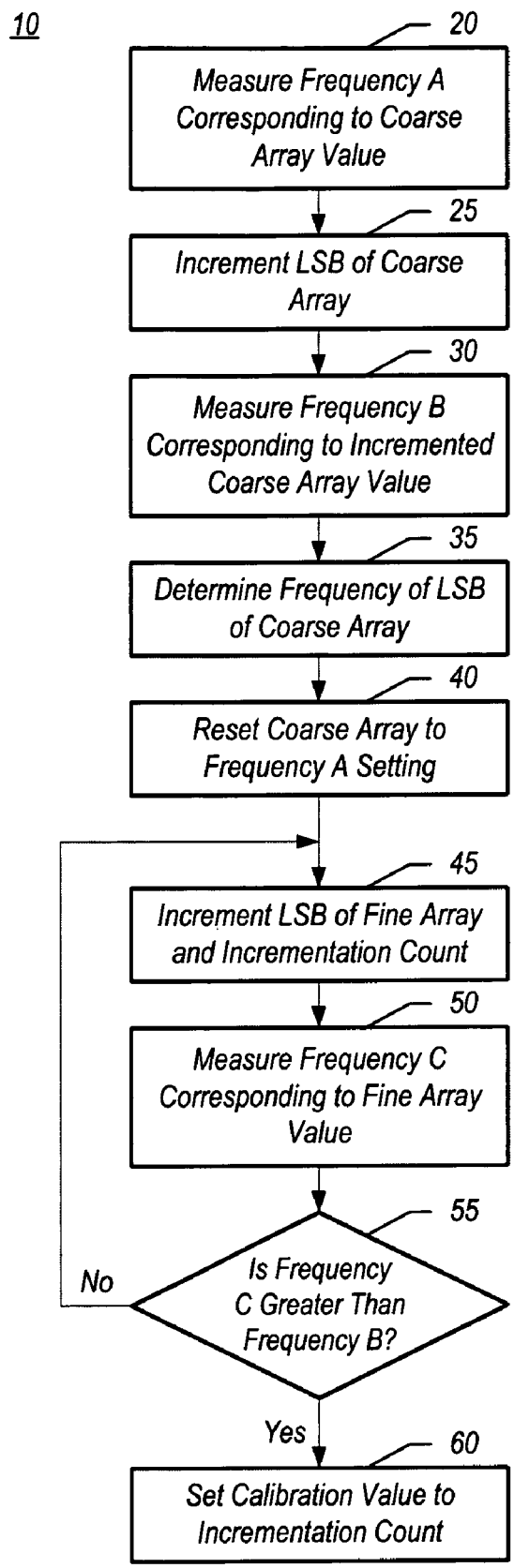
FIG. 1 is a flow diagram of a calibration method in accordance with one embodiment of the present invention.

To generate a desired frequency in an NCO, one or more tuning steps may be performed via a frequency control circuit. For example, there may be a coarse tuning section and one or more finer tuning sections, often referred to as a medium tuning section and a fine tuning section. In generating a desired frequency, first the coarse tuning section may be tuned to generate a rough approximation of the desired frequency. Then the medium tuning section may be tuned to more closely generate the desired frequency. Finally, the fine tuning section may be tuned to finely tune to this desired frequency. In some embodiments tuning of the three tuning sections (or more or less in a given implementation) may be performed simultaneously. In some implementations, the fine tuning section may be used to accurately control frequency, while the medium tuning section in combination with the fine tuning section may be used to control temperature variations.

In various implementations, each of these tuning sections may be formed using one or more capacitors. More specifically, each tuning section may be formed of one or more capacitor banks. For ease of discussion, each tuning section may have a single corresponding capacitor bank, although the scope of the present invention is not so limited. Thus in the following discussion each tuning section has a corresponding capacitor bank of a different capacitance level to handle tuning to different ranges of accuracy. However, in other embodiments a single capacitor bank having a sufficient number of branches may be used to perform all tuning, e.g., coarse through fine.

In an implementation having two tuning sections (for ease of illustration), a coarse bank may provide the ability to cover a desired frequency range, and a fine bank may provide the ability to step in small frequency increments. While a desired frequency range may vary depending upon a given implementation, in embodiments in which the frequency control circuit is implemented in a radio tuner, for example an FM tuner, the desired frequency range may accommodate the entire frequency spectrum of the FM band.

Furthermore, it is to be understood that different banks may provide control to a desired degree of accuracy. While described herein as including two banks, namely a coarse bank and a fine bank, it is to be understood that in some embodiments at least three banks may be present, with each having a different degree of control. For example, a coarsest bank may be used to control frequency to a first coarse level, e.g., within approximately 0.05% of a desired radio channel, for example, while a coarse or medium bank may be used to control frequency to an accuracy of approximately 0.02%. The coarsest bank may include capacitors on the order of approximately 1.0 to 4.0 femtoFarads (fF), in some embodiments, and the medium bank capacitors may be between approximately 0.5 and 1.5 fF. Furthermore, a fine frequency bank may be used to finely tune a radio channel to approximately 0.002%, and may include effective capacitor steps between approximately 50 and 150 attoFarads (aF). However, it is to be understood that additional or fewer array banks may be implemented in different embodiments.

The multiple banks may be designed in completely different ways in some implementations, with considerable savings in hardware. For example, a coarse bank may be implemented using exponentially-related capacitor sizes to achieve power-of-two fixed frequency jumps for each control bit. In contrast, a fine bank may be a thermometer-coded set of "equal" size steps to achieve greater uniformity. Other implementations, such as radix-controlled banks may also be used.

In practice, particularly where a single array bank is present, problems can arise because the uncertainty in the coarsest bit can be large compared to the least coarse bits, leaving gaps in the frequency coverage. Consider the example of a 10-bit coarse array. In such an array, a most significant bit (MSB) would have to vary over process by less than 0.1% (i.e., 1 part in 1024) to avoid gaps in obtainable frequencies of the size of a least significant bit (LSB) of the coarse array. The gap would occur for code changes from 0111111111 to 1000000000 and similar changes. To reduce accuracy requirements for a coarse bank implementation, the number of bits (i.e., of a digital control word) to effect changes in the coarse bank may be reduced. For example, if only 5 bits of control were used, the accuracy of the MSB would need to be controlled to only 1 part in 32 (instead of 1 part in 1024 for the earlier example), or about 3%.

To achieve the equivalent small frequency steps, a fine bank of frequency controls may also be implemented. The fine bank has small frequency steps, and may be designed to have a range sufficient to reliably cover a single coarse bank LSB of frequency change. Since the range of the fine array is small compared to the total range, the accuracy requirements for this array can be relaxed. In one embodiment, the fine array may be 5 bits, with 3% accuracy (similar to the coarse array), although the scope of the present invention is not so limited. In other embodiments, the fine array range may be chosen to be a bit larger than the coarse array LSB, so that implementation and process variations need not be tightly controlled.

For purposes of uniformity across a frequency range, the coarse and fine banks may desirably appear to be a single "seamless" bank. However, because of the different sizes, designs, chip locations, and the like, there may be differences between the banks. These differences may vary based on process, temperature, voltage and the like. Accordingly, adjustments may be made to account for such differences.

While different implementations are possible, in one embodiment a calibration procedure may be performed to account for the differences between the banks. In general, the calibration may be used to determine how many fine bits are in a coarse LSB at the time of calibration (e.g., during operation at given temperature and voltage levels for a particular device's manufacturing process variation). Using the determined calibration, frequency adjustments may be made to obtain a desired frequency.

The calibration procedure may begin by determining a frequency for an arbitrary setting of the coarse array bank. Different measurement methods such as use of a frequency counter and a reference time may be implemented to determine the coarse frequency value. For example, a reference clock and counter to measure a frequency A for the arbitrary value of coarse bits can be used. Then, the coarse control (i.e., digital control word) may be incremented by a LSB, and a second frequency B is measured. The difference, B−A, is thus the frequency range corresponding to the range of a coarse LSB.

To further perform this calibration method, next the coarse control is reset to frequency A, and the fine bank is incremented by a LSB and a frequency C is measured. This incrementation and measurement is continued until C−A>B−A, or equivalently until C>B. Then the number of fine increments N is approximately the value of the fine bank corresponding to the range of a coarse LSB.

To use the calibration results in controlling a NCO frequency, the following method may be implemented. As desired for finely controlling frequency, the fine bank control may be adjusted by incrementing or decrementing a fine bank LSB. When, however, the limit of the fine bank is reached (e.g., attempting to increment past the maximum fine bank control, or attempting to decrement below zero for the fine bank control), the fine count may be adjusted by N, or N−1 in some embodiments where N is a value determined in accordance with Eq. 1 below. Adjusting by a value of N−1 (e.g., decrement by N−1 for an increment command, or increment by N−1 for a decrement command) may provide for monotonic control. Simultaneously, the coarse bank may be adjusted (incremented or decremented) by a coarse LSB. The result is a monotonic change of size less than or equal to a fine bank LSB frequency change.

Embodiments of the present invention thus allow for relaxed tolerances on oscillator components and relaxed matching between capacitor banks, allowing different implementation techniques if desired. Furthermore, by performing part-by-part calibration, process variation effects are reduced, improving NCO performance accordingly. While described herein with two banks, the concept can be extended to more than two banks, for greater range, smaller step sizes, and looser tolerances on capacitor values. By changing the coarse LSB only when the fine range is at its maximum or minimum, hysteresis on the use of the coarse bank may be obtained.

Referring now to FIG. 1, shown is a flow diagram of a method in accordance with one embodiment of the present invention. As shown in FIG. 1, method 10 may be used to calibrate multiple capacitor banks in accordance with an embodiment of the present invention. As described above, a coarse array bank and a fine array bank may be designed in different manners, may be located on different portions of an integrated circuit and/or may operate differently based on process and temperature variations due to their potentially different design and capacitor sizes. Accordingly, method 10 may be used to determine a calibration to apply in fine tuning of a desired frequency. That is, method 10 may be used to determine a calibration to apply in adjusting capacitance values of at least the fine array bank in fine tuning a frequency of a local oscillator.

As shown in FIG. 1, method 10 may begin by measuring a frequency A corresponding to a coarse array value (block 20). For example, this frequency A may be measured using a reference clock and a counter to measure the frequency of an arbitrary value of the coarse array. That is, an arbitrary digital control word (for example) may be applied to the coarse array bank to generate an oscillator output of an arbitrary frequency A. Next, the LSB of the coarse array may be incremented (block 25). While described as incrementing the LSB, in other embodiments block 25 may alternately decrement the LSB. Then a frequency B corresponding to the adjusted coarse array value may be measured (block 30). This frequency value may be measured as described above. Based on the difference between frequency B and frequency A, the frequency step corresponding to the LSB of the coarse array may be determined (block 35).

Next, the coarse array may be reset to the frequency A setting (block 40). Then the fine array bank may be manipulated to determine a number of fine increments that corresponds substantially to the frequency range of the coarse array LSB. Accordingly, the LSB of the fine array may be incremented. Furthermore, an incrementation count may be also incremented (block 45). The incrementation count may correspond to a number of iterations of block 45 executed in the loop described herein. This loop further includes measuring a frequency C corresponding to the fine array value (block 50). The loop further includes determining if the frequency C is greater than the frequency B (diamond 55). If not, control returns to block 45 of the loop, where the LSB of the fine array and the incrementation count are both incremented.

When it is determined that frequency C of the fine array value is greater than the frequency range of the LSB of the coarse array (i.e., frequency B), control passes to block 60. There, a calibration value may be set that corresponds to the incrementation count presently existing (block 60). This incrementation count or calibration value, N, is thus approximately the value of the fine array bits corresponding to the range of a coarse array LSB. In other embodiments, N may be determined by calculating a ratio according to the following equation:

$$N=(B-A)/(C-A) \qquad (\text{Eq. 1})$$

This calibration process may be performed on startup of a system including an oscillator in accordance with an embodiment of the present invention. In other embodiments, such a calibration may occur periodically to account for temperature variations, such as upon each tuning operation. When determined, the calibration value may be stored in an appropriate storage medium, such as a non-volatile memory or the like.

Figure 2:
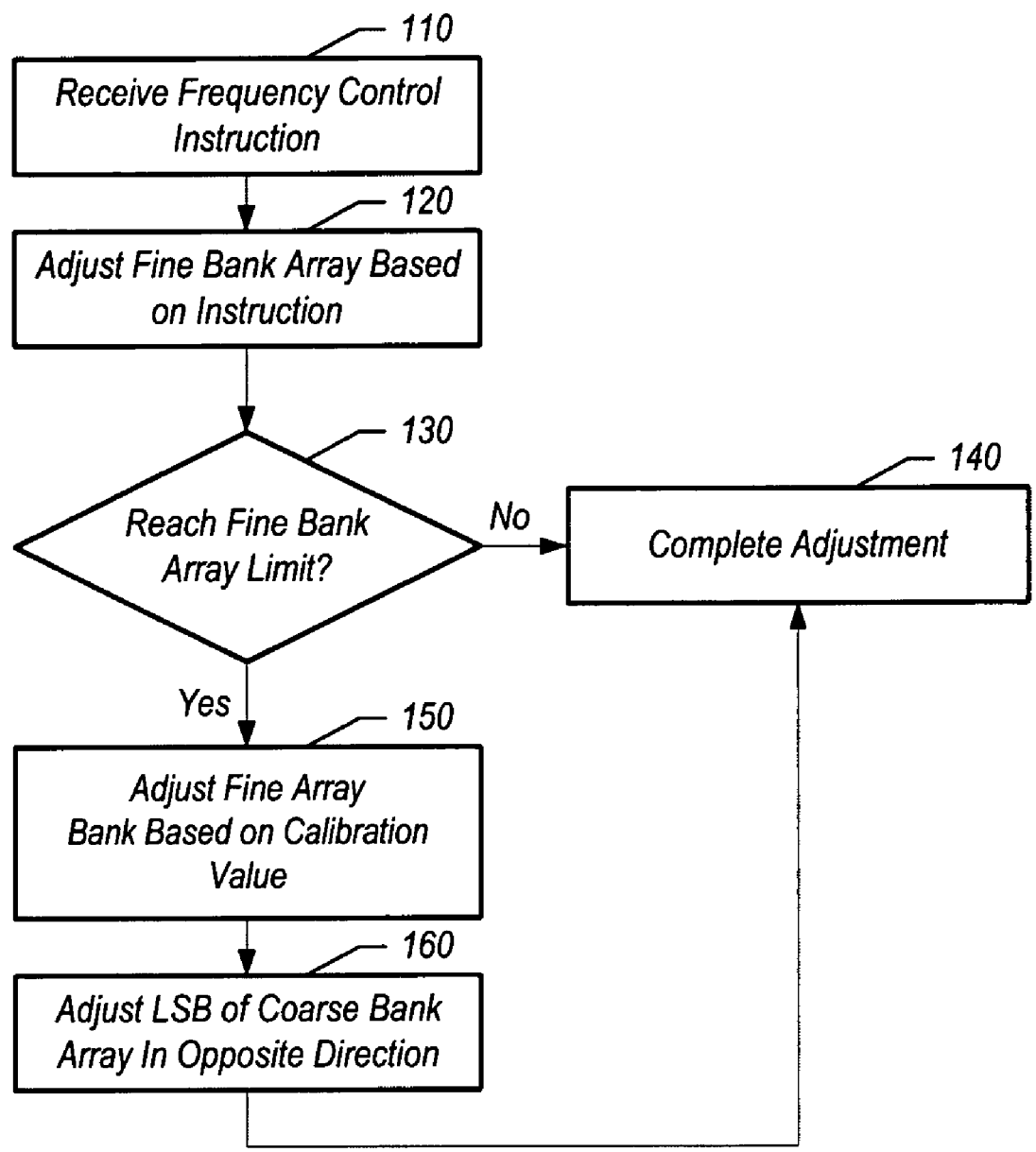
FIG. 2 is a flow diagram of a method of tuning an oscillator frequency in accordance with an embodiment of the present invention.

Referring now to FIG. 2, shown is a flow diagram of a method of using a calibration value in accordance with an embodiment of the present invention. As shown in FIG. 2, method 100 may be used to fine tune an oscillator to a desired frequency using a calibration value previously determined. In some embodiments the calibration value may be determined as described above regarding FIG. 1. However, other manners of calibrating for differences between different capacitor array banks may be implemented.

Referring now to FIG. 2, method 100 may begin by receiving a frequency control instruction (block 110). For example, the frequency control instruction, which may be a digital signal, can be received from an automatic frequency control (AFC) circuit. Using this signal, the fine bank array may be adjusted (block 120). For example, the control word may be sent to a plurality of control switches that switch different capacitances into or out of the array, depending upon the value of the control signals. As will be described further below, in some embodiments a plurality of metal-oxide-semiconductor field effect transistor (MOSFET) switches may receive respective bits of the control word and switch a respective capacitance into or out of a capacitor array line.

Next, it may be determined if a fine bank array limit has been reached (diamond 130). If the instruction is an increment instruction, it may be determined whether the maximum array value has been reached, while if the instruction is a decrement instruction it may be determined if the lower limit of the array has been reached. If the limit has not been reached, the adjustment to the array bank is thus completed (block 140).

If instead a limit of the fine array has been reached, control passes to block 150. There, the fine array bank may be adjusted based upon the calibration value (block 150). For example, the fine array bank may be adjusted using a predetermined portion of the calibration value. This portion, in some embodiments, may correspond to a value of N−1 that is added to or subtracted from the fine array bank value. In such embodiments, this N−1 portion may be used to adjust the fine bank array to attain a monotonic control. After adjusting the fine array bank (or substantially simultaneously therewith), the LSB of the coarse bank may be adjusted in the opposite direction (block 160). For example, if the fine array bank is decremented (e.g., by N−1) the coarse array bank may be incremented by the LSB. Accordingly, the fine tuning adjustment to the oscillator results in a frequency change of a size less than or equal to a fine bank LSB. Accordingly, the frequency adjustment is completed (block 140), and method 100 concludes.

As described above, each of multiple capacitor banks used to control frequency in a controlled oscillator may be formed of one or more switchable capacitors, and may be controlled in different manners. Furthermore, in various embodiments, different structural implementations may be effected to provide for small delta-C changes. In some embodiments, capacitor branches that form capacitor banks in accordance with an embodiment of the present invention may be designed to effect small delta-C changes. As used herein, the term "small delta-C" may correspond to changes in capacitance values of between approximately 50 aF and 250 aF. Such small changes in capacitance may lead to changes in frequency on the order of between approximately 0.001% and 0.0003%, in some implementations.

Figure 3:
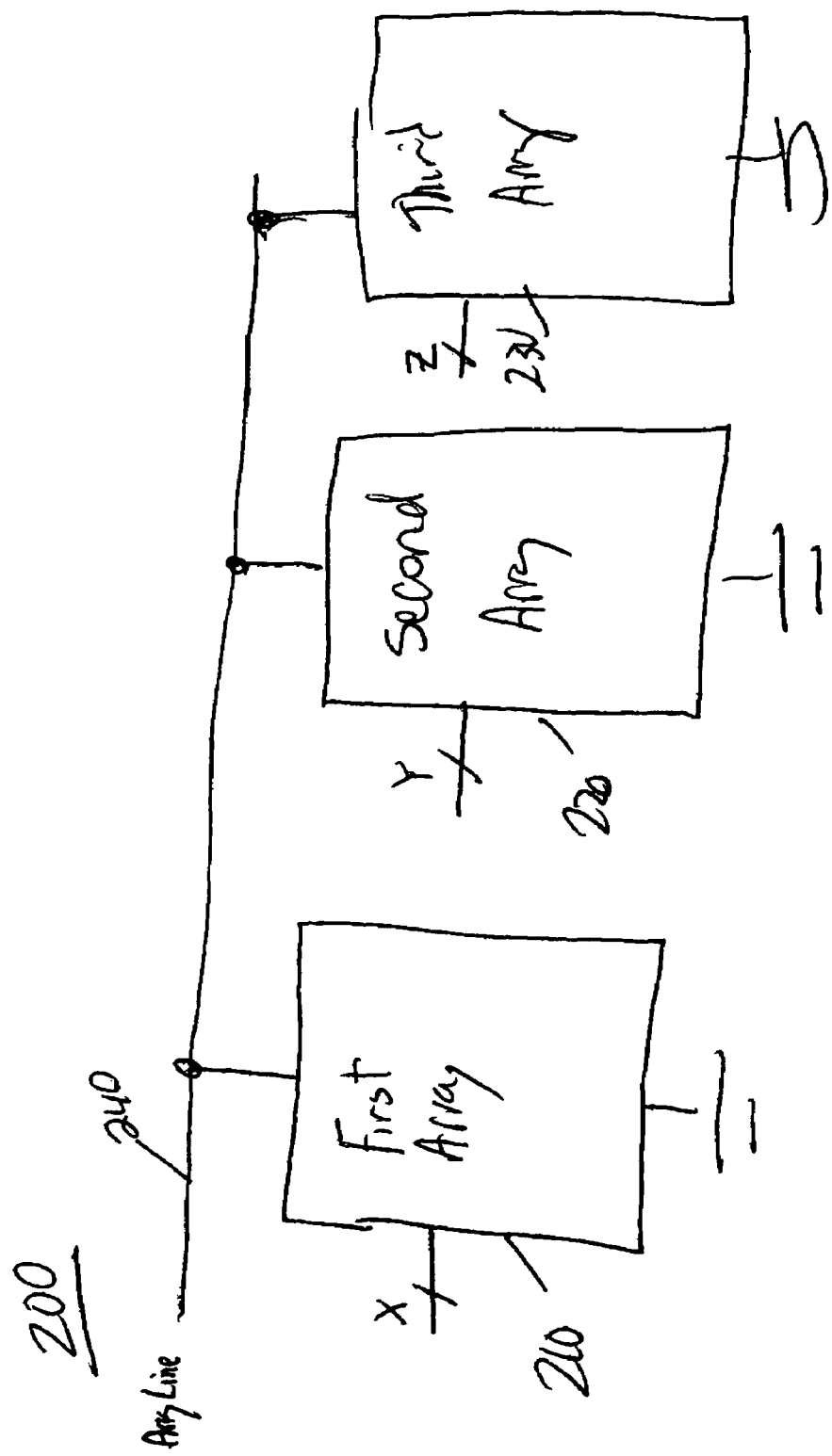
FIG. 3 is a block diagram of a capacitor array in accordance with one embodiment of the present invention.

Referring now to FIG. 3, shown is a block diagram of a capacitor array in accordance with one embodiment of the present invention. As shown in FIG. 3, array 200 may include multiple sections or banks. Specifically, as shown in FIG. 3, a first array 210, a second array 220 and a third array 230 may each be coupled between an array line 240 and a ground potential. While shown in the embodiment of FIG. 3 as including three such arrays or tuning sections, it is to be understood that more or fewer such arrays may be present in other embodiments. As also shown in FIG. 3, each array portion is to receive a number of bits of a frequency control instruction (e.g., bits X, Y, and Z, respectively). In different implementations, each of the arrays may include different structures, and may even be located on different portions of a substrate.

In various embodiments, at least third array 230 may include one or more capacitors to effect small delta-C changes. Accordingly, at least third array 230 may include various capacitor structures in accordance with different embodiments described herein. In such manner, monotonic changes in a frequency control instruction may lead to monotonic changes in capacitance values on array line 240. Furthermore, while not shown in FIG. 3, it is to be understood that a controller may be coupled to capacitor array 200 to enable calibration of third array 230 to the remaining portion of capacitor array 200 such that a calibration value may be determined and used in implementing frequency control in accordance with an embodiment of the present invention.

Figure 4:
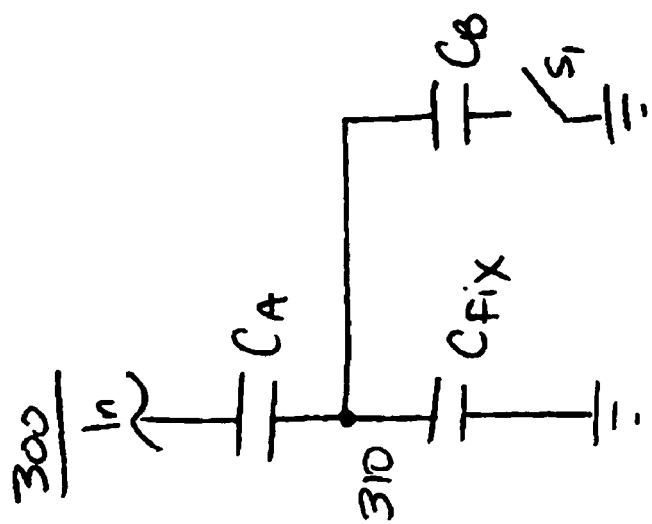
FIG. 4 is a schematic diagram of a capacitor branch in accordance with one embodiment of the present invention.

Referring now to FIG. 4, shown is a schematic diagram of a capacitor branch in accordance with one embodiment of the present invention. As shown in FIG. 4, capacitor branch 300 includes a first capacitor $C_A$ and a second capacitor $C_{FIX}$ coupled in series between an input node and a ground terminal. A third capacitor $C_B$ is coupled to a divider node 310 coupled between the first and second capacitors. The input node may be coupled to a capacitor array line, which in turn is coupled to a corresponding controlled oscillator to provide the load capacitance thereto. Third capacitor $C_B$ is further coupled to a switch S1 that is also coupled to the ground potential. In some embodiments, the capacitors may be implemented as finger capacitors, however the scope of the present invention is not so limited. In other embodiments metal-insulator-metal (MIM) capacitors, MOS capacitors or other such structures may be used. In various embodiments, switch S1 may be implemented as a transistor, such as a MOSFET, e.g., an n-channel MOSFET. However, it is to be understood that switches may be implemented using any desired technology. Accordingly, switch S1 may be controlled by a bit of a digital control word, such as a digital control word generated as described above.

Different capacitance values may be realized for capacitor branch 300 based on whether switch S1 is on or off. Referring now to FIG. 5A, shown is a schematic diagram corresponding to capacitor branch 300 when switch S1 is on. As shown in FIG. 5A, when switch S1 is on, third capacitor $C_B$ is coupled in parallel with second capacitor $C_{FIX}$. The effective capacitance $C_{eff}$ of capacitor branch 300 when switch S1 is on thus corresponds to:

$$C_{eff} = \frac{C_A(C_{FIX} + C_B)}{C_A + (C_{FIX} + C_B)}. \quad\text{(Eq. 2)}$$

Figure 5B:
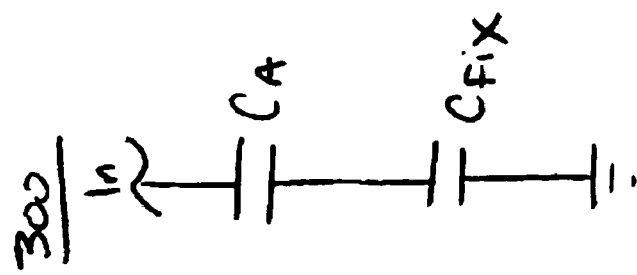
FIG. 5B is a schematic diagram corresponding to the capacitor branch of FIG. 4 in another mode of operation.
Figure 5A:
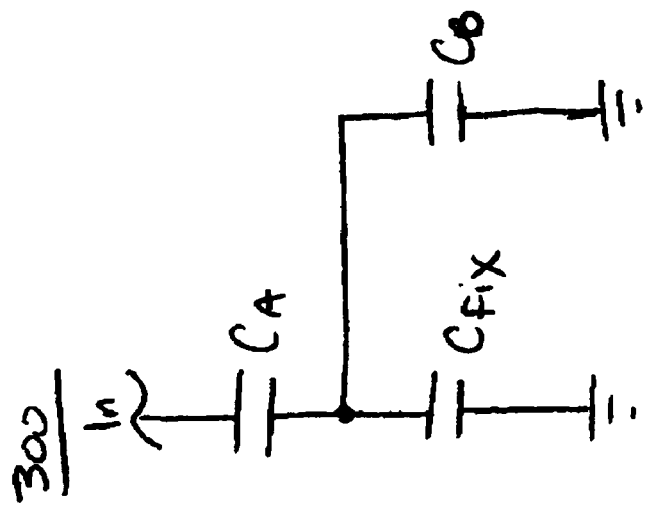
FIG. 5A is a schematic diagram corresponding to the capacitor branch of FIG. 4 in one mode of operation.

When instead switch S1 is off, the effective capacitance corresponds to that of first capacitor $C_A$ and second capacitor $C_{FIX}$ coupled in series as shown in FIG. 5B. Accordingly, when the switch is off, the effective capacitance corresponds to:

$$C_{eff} = \frac{C_A C_{FIX}}{C_A + C_{FIX}}. \quad\text{(Eq. 3)}$$

Therefore, the change in capacitance achieved in accordance with this embodiment of the present invention is:

$$\Delta C = \frac{C_A(C_{FIX} + C_B)}{C_A + (C_{FIX} + C_B)} - \frac{C_A C_{FIX}}{C_A + C_{FIX}} = \quad \text{(Eq. 4)}$$

$$\frac{C_A^2 C_B}{(C_A + C_B + C_{FIX})(C_A + C_{FIX})}.$$

The capacitive divider formed by $C_A$ and either $C_B$ in parallel with $C_{FIX}$ or $C_{FIX}$ alone, depending on whether switch S1 is on or not respectively, thus lowers the capacitance seen at the input node of branch 300. When switch S1 turns on, the divided capacitance with $C_A$ increases from $C_{FIX}$ to $C_{FIX}+C_B$. This increase due to the inclusion of $C_B$ is then divided (reduced) through the capacitive divider formed by $C_A$. Thus, any capacitive changes due to switch S1 turning on or off is attenuated by the capacitive divider, thereby giving a small delta-C. In one embodiment, the values of $C_A$ and $C_B$ may be approximately on the order of one femtoFarad (fF), while $C_{FIX}$ may be approximately on the order of 20 fF, although the scope of the present invention is not so limited. Such values of course will vary depending on a given implementation, including desired frequency, weighting scheme, and location of a branch within a bank.

For example, in another implementation $C_A$ may have a value of approximately 3 fF, $C_{FIX}$ may have a value of approximately 24 fF, and $C_B$ may have a value of approximately 12 fF. In such an implementation, raising the value of any of $C_A$, $C_B$ and $C_{FIX}$ increases the effective capacitance value of branch 300, whether switch S1 is on or off. Increasing the value of $C_{FIX}$ however, reduces the change in capacitance when switch S1 is switched.

Figure 6:
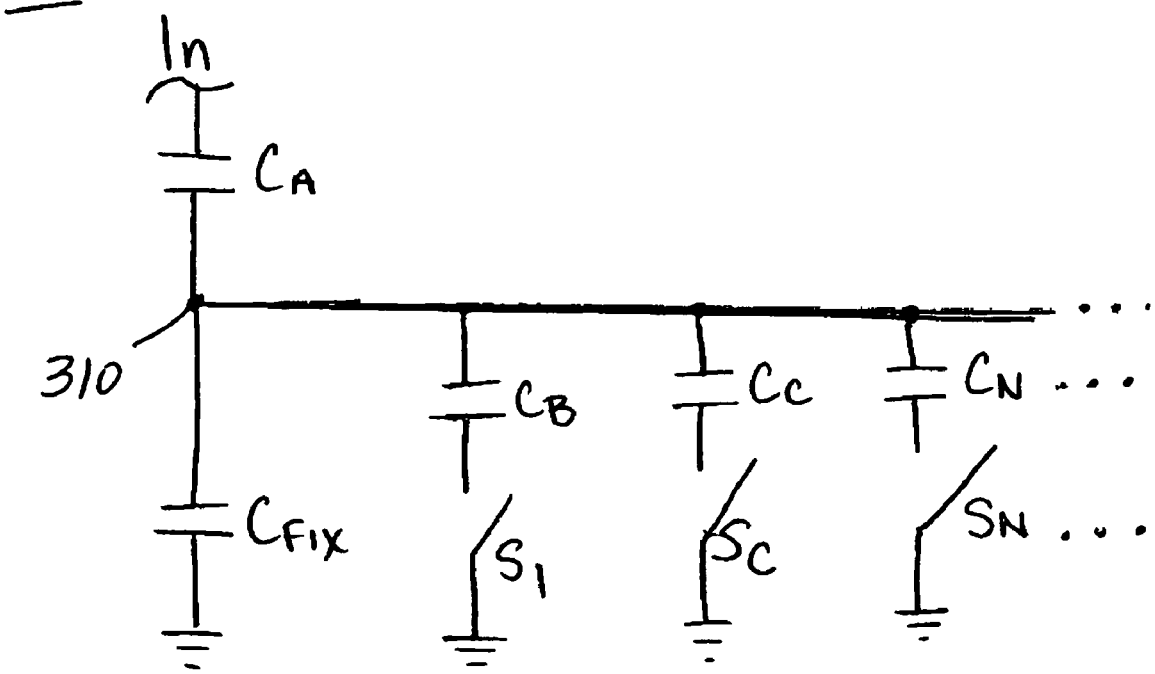
FIG. 6 is a schematic diagram of a capacitor branch in accordance with another embodiment of the present invention.

In some implementations, even smaller delta-C values may be effected using multiple switches (i.e., controlled by multiple bits) to cause a plurality of capacitors to be switched in parallel into or out of a divider node. Referring now to FIG. 6, shown is a schematic diagram of a capacitor branch in accordance with another embodiment of the present invention. As shown in FIG. 6, branch 350 includes first capacitor $C_A$, second capacitor $C_{FIX}$ and third capacitor $C_B$ as described above with regard to FIG. 4. Furthermore, as shown in FIG. 6, a plurality of additional capacitors ($C_C \ldots C_N$) are coupled in parallel between divider node 310 and a respective switch ($S_C \ldots S_N$), each of which in turn is also coupled to a ground potential. As shown in FIG. 6, additional capacitors $C_C \ldots C_N$ may be coupled between divider node 310 and a respective one of switches $S_C$-$S_N$, coupled to ground potential. Depending upon the number of switchable capacitors within a branch, capacitance may be reduced by a desired amount. In some embodiments, these additional capacitors (e.g., $C_C$-$C_N$) may be weighted in a desired manner. For example, in some implementations second capacitor $C_{FIX}$ may be the largest capacitor, and the one or more switched capacitors may be much smaller, adding very little to overall real estate consumption, while providing for small delta-C's.

Figure 7:
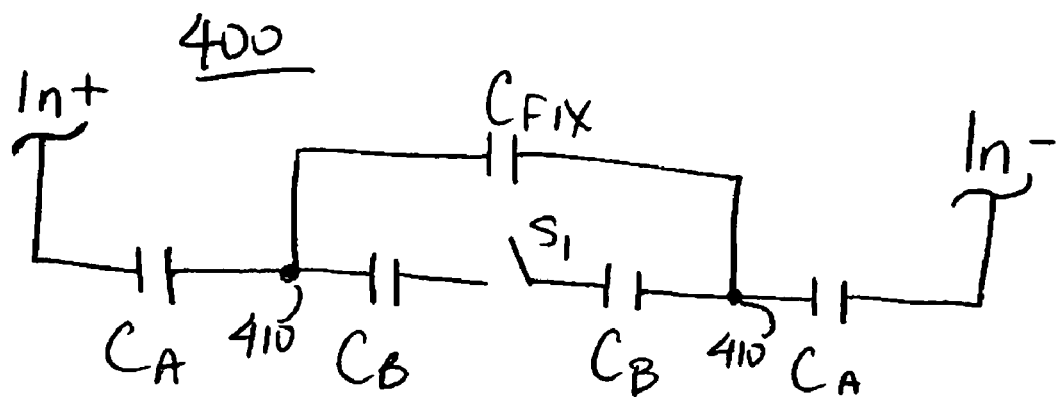
FIG. 7 is a schematic diagram of a differential capacitor branch in accordance with an embodiment of the present invention.

In other embodiments, a capacitor structure may be implemented with a differential configuration. Referring now to FIG. 7, shown is a schematic diagram of a differential capacitor branch in accordance with an embodiment of the present invention. As shown in FIG. 7, capacitor branch 400 includes respective first capacitors $C_A$ and respective third capacitors $C_B$ coupled between differential input nodes In+ and In−. A switch S1 is coupled between the pair of third capacitors $C_B$. Furthermore, a second capacitor $C_{FIX}$ is coupled in parallel between the pair of third capacitors $C_B$ at respective differential divider nodes 410. While not shown in the embodiment of FIG. 7, it is to be understood that a plurality of additional pairs of capacitors may be coupled in parallel between divider nodes 410 and separated by a switch, in similar manner to that shown with respect to third capacitors $C_B$. In some embodiments, a differential implementation such as that shown in FIG. 7 may have lower switch parasitics.

In some embodiments, clamps or large resistors may be added to capacitor branches to ensure that nodes are not floating and to reduce parasitic effects. Such floating nodes can add noise into a system in the presence of non-linear capacitors of different capacitor branches. When nodes float, drifting capacitance can occur leading to poor settling time and introducing noise into a system. Accordingly, use of clamps or other mechanisms to prevent floating nodes may be implemented.

Figure 8:
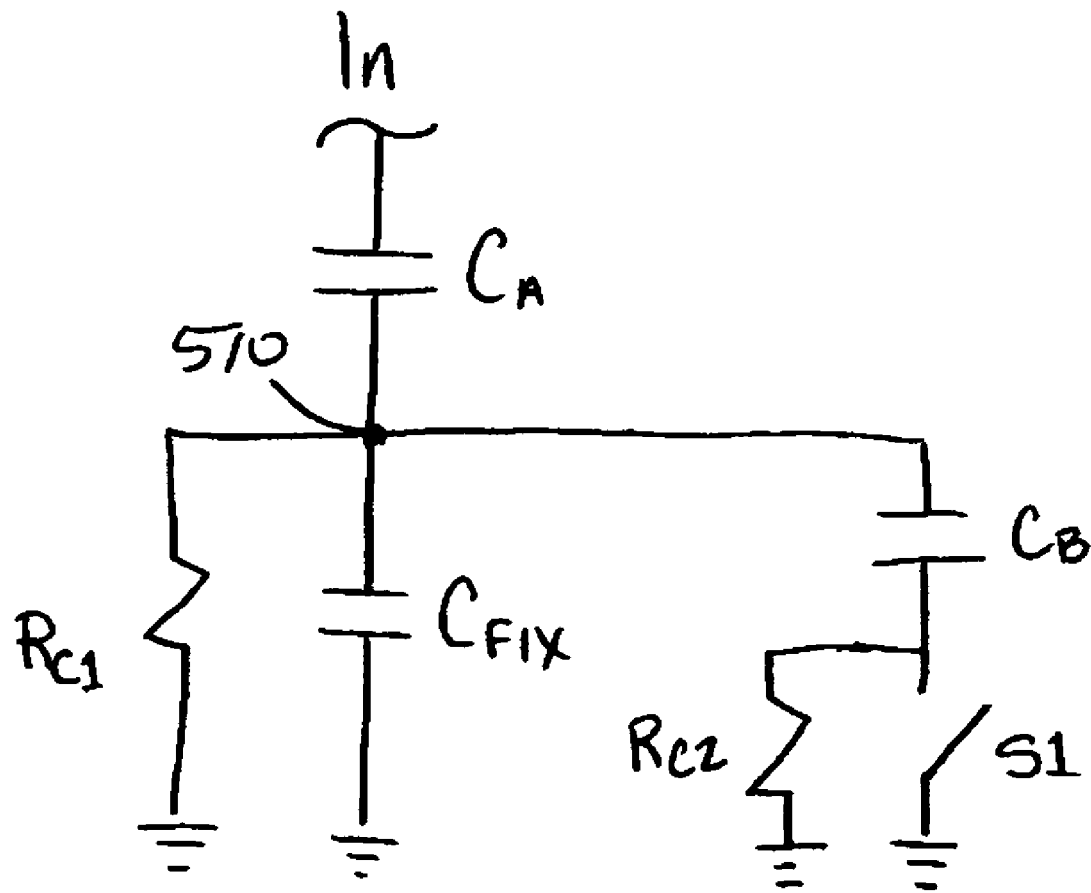
FIG. 8 is a schematic diagram of a capacitor branch in accordance with another embodiment of the present invention.

Referring now to FIG. 8, shown is a schematic diagram of a capacitor branch in accordance with another embodiment of the present invention. As shown in FIG. 8, capacitor branch 500 includes a first capacitor $C_A$, second capacitor $C_{FIX}$ and third capacitor $C_B$, as described above with respect to FIG. 4, for example. As further shown in FIG. 8, a first resistive clamp $R_{C1}$ is coupled between divider node 510 and a ground potential. An additional resistive clamp $R_{C2}$ is coupled in parallel with switch S1 between third capacitor $C_B$ and ground.

In addition to avoiding floating potentials at the various nodes (i.e., node 510 and the switch node between third capacitor $C_B$ and switch S1), circuit 500 is also relatively insensitive to parasitic capacitance in terms of attaining a small delta-C. That is, any parasitic capacitance due to first resistive clamp $R_{C1}$ will add to the capacitance of second capacitor $C_{FIX}$, which also reduces a change in capacitance. Similarly, the parasitic capacitance due to second resistive clamp $R_{C2}$ will also reduce the change in capacitance.

The resistive clamps may be implemented with MOS transistors, biased to be barely on. For example, the resistive clamps may be effected via a MOS transistor biased in a triode region of operation. The capacitor impedance may be fairly large because of the small resistance. For example, the clamping resistors may be on the order of several kiloohms.

In various embodiments, one or more capacitor banks may be implemented to control frequency in a NCO or other discretely controlled oscillator. For example, instead of a phase-locked loop (PLL), a frequency-locked loop may be provided, avoiding the need for a loop filter and other components that negatively effect real estate and power consumption. However, capacitor banks in accordance with an embodiment of the present invention may also be used in connection with analog controlled oscillators, such as a VCO controlled by an analog varactor.

The switches used to switch in one or more parallel capacitors may cause a parasitic capacitance. Further, the larger switch that is used, the more parasitic capacitance is generated. However, the parasitic capacitance may be fully modeled and controlled by adjusting the size of the capacitors and switches accordingly. For example, in an implementation used to generate frequencies in a radio band, e.g., an FM band, first capacitor $C_A$ may have a value of between approximately 6 and 12 fF, while second capacitor $C_{FIX}$ may be approximately three times large (e.g., approximately 24-36 fF) and third capacitor $C_B$ may be approximately six times larger (e.g., approximately 36-72 fF). In one particular implementation, $C_A$ may be approximately 9 fF, while $C_{FIX}$ is approximately 27 fF and $C_B$ is approximately 54 fF. These capacitor values may thus compensate for parasitics. A capacitor branch so formed may provide for a delta-C of approximately 150 aF by switching S1 on or off.

Figure 9:
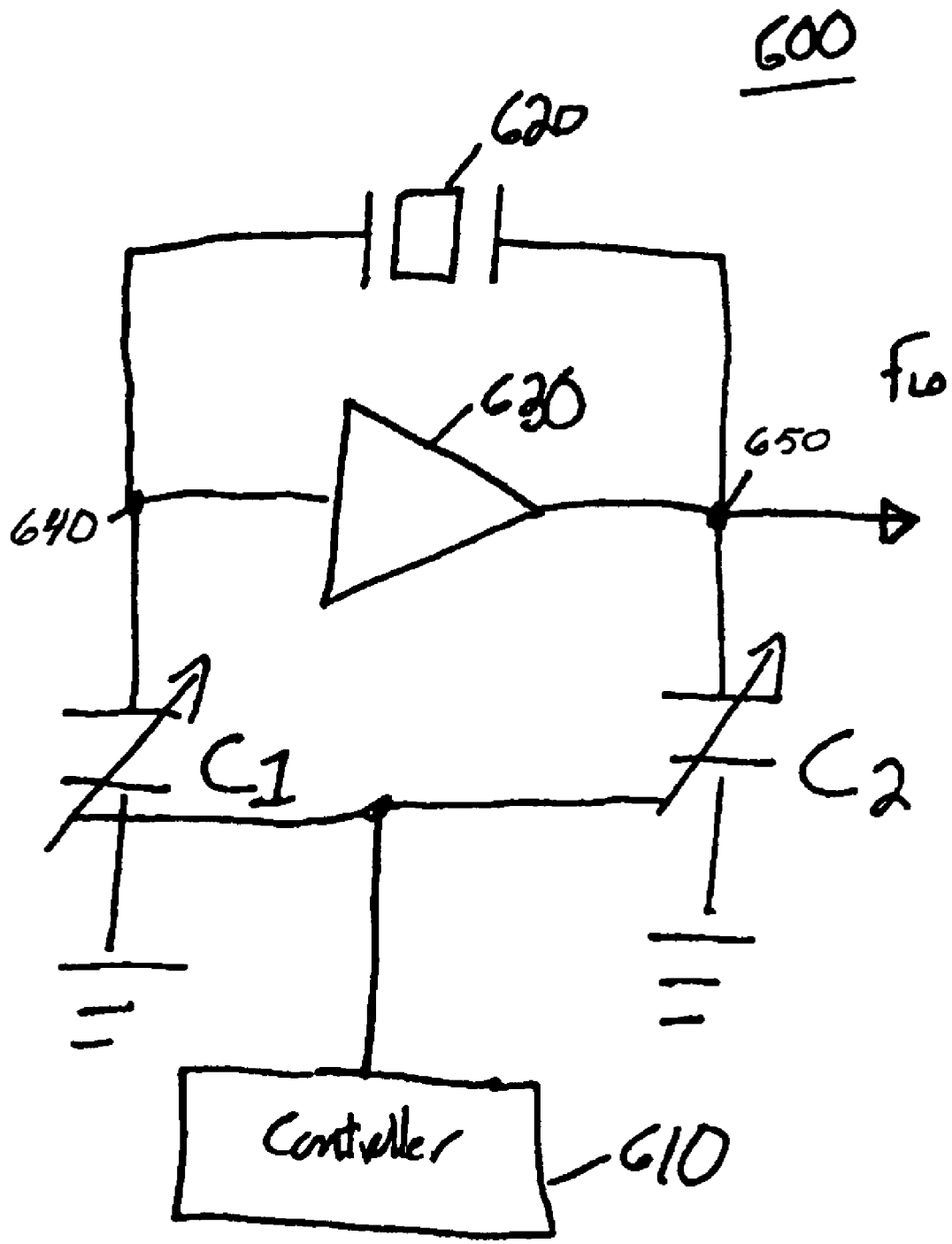
FIG. 9 is a block diagram of an oscillator in accordance with one embodiment of the present invention.
Figure 1O:
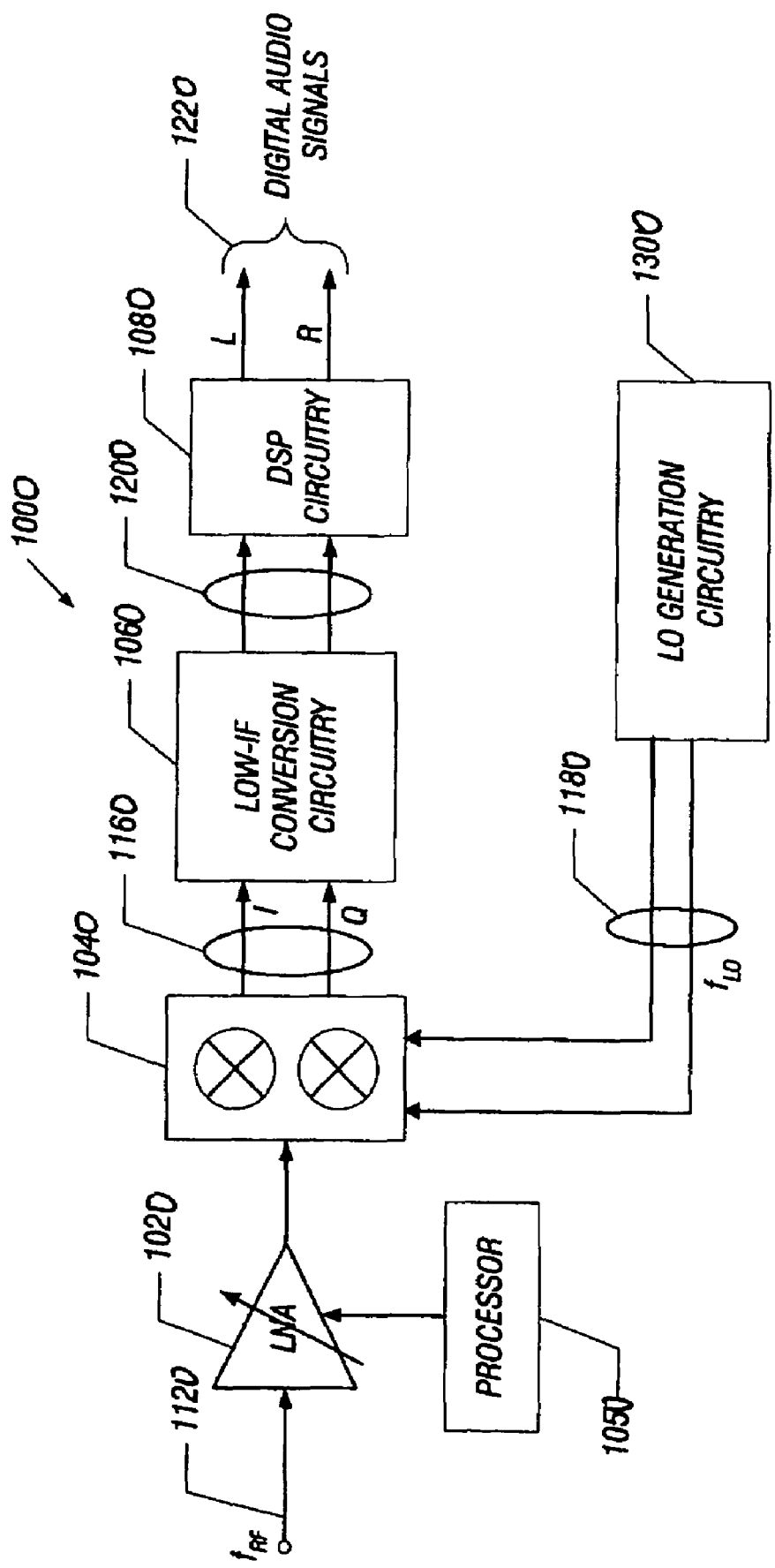

Referring now to FIG. 9, shown is a block diagram of an oscillator in accordance with one embodiment of the present invention. As shown in FIG. 9, oscillator 600 may be an NCO including one or more capacitor banks in accordance with an embodiment of the present invention. A controller 610, which may be a processor, microcontroller or other programmable control device, and which may include memory for program storage, is also shown in FIG. 9. Controller 610 may perform frequency control and calibration schemes (e.g., stored in program memory) as described herein and provide digital control signals to load capacitors C1 and C2. These load capacitors C1 and C2 may each include one or more capacitor banks, such as those described herein. In some embodiments, a single digital control word may be sent to each of load capacitors C1 and C2. In other embodiments, a separate digital control word may be sent to each of the one or more banks of arrays in each of load capacitors C1 and C2, depending upon a particular implementation (e.g., number of branches in the array).

Based on the value of the control signals, a capacitance value will be provided on capacitor array lines from capacitors C1 and C2 to nodes 640 and 650, respectively. Nodes 640 and 650 are coupled to an input and an output of an amplifier 630. Amplifier 630 may facilitate oscillation by compensating for losses in oscillator 600 and to maintain oscillation as controlled by controller 610. Furthermore, a crystal 620 is coupled in parallel with amplifier 630 between nodes 640 and 650. Accordingly, a output frequency ($f_{LO}$) is generated based upon control signals sent from controller 610. In various embodiments, controller 610 may be implemented on the same substrate as capacitors C1 and C2 and amplifier 630. For example, these components may be integrated on a single substrate of an integrated circuit of a radio receiver, transceiver, or other RF mixed signal device.

While oscillator 600 of FIG. 9 may take the form of a crystal oscillator such as a Colpitts oscillator, it is to be understood that other oscillator types are possible. Furthermore, other components may be included within oscillator 600, such as one or more load resistances, buffers, bias and other control circuitry, and the like.

Referring now to FIG. 10, shown is a block diagram of a radio tuner in accordance with one embodiment of the present invention. FIG. 10 is a block diagram of an embodiment 1000 for an integrated terrestrial broadcast receiver that utilizes a low-IF architecture. The input signal spectrum ($f_{RF}$) 1120 may be a RF signal spectrum that includes a plurality of channels that can be tuned. For purposes of discussion, the RF signal spectrum ($f_{RF}$) 1120 will be discussed primarily with respect to the RF signal spectrum ($f_{RF}$) 1120 being an FM terrestrial broadcast spectrum that includes a plurality of different FM broadcasts channels centered at different broadcast frequencies.

Looking back to the embodiment 1000 in FIG. 10, a low noise amplifier (LNA) 1020 receives the RF signal spectrum ($f_{RF}$) 1120. LNA 1020 may be digitally controlled by a processor 1050, which may be a microcontroller in some embodiments. Processor 105 may also be used to perform automatic gain control (AGC) for receiver 1000 instead of the AGC being provided by analog circuitry. Processor 1050 includes a processing core that executes instructions (stored in a memory, for example, of the processor) for purposes of sensing various gains and other parameters of receiver 1000 and controlling LNA 1020 (and other portions) of receiver 1000 accordingly. In some embodiments of the invention, processor 1050 may be a microcontroller, such as a microcontroller based on the 8051 instruction set. However, a processor other than a microcontroller as well as a different type of microcontroller may be used in other embodiments of the invention.

In some embodiments of the invention, processor 1050 and components of the RF and IF processing chain may be integrated on the same semiconductor die (i.e., substrate) and thus may be part of the same semiconductor package or integrated circuit (IC). In other embodiments of the invention, processor 1050 may be part of the same semiconductor package as the components of the RF/IF chain but located on a separate die. In still other embodiments of the invention, processor 1050 and RF/IF chain components may be located in different semiconductor packages. Thus, many variations are possible and are within the scope of the appended claims.

Still referring to FIG. 10, the output of LNA 102 is then applied to a mixer 1040, and mixer 1040 generates in-phase (I) and quadrature (Q) output signals, as represented by signals 1160. To generate these low-IF signals 1160, the mixer 1040 uses phase shifted local oscillator (LO) mixing signals ($f_{LO}$) 1180. The LO generation circuitry 1300 includes oscillation circuitry such as that of FIG. 9 and outputs the two out-of-phase LO mixing signals ($f_{LO}$) 1180 that are used by the mixer 1040. The outputs of mixer 1040 are at a low-IF, which can be designed to be fixed or may be designed to vary. In some embodiments, processor 1050 may also execute instructions to control desired frequency and perform calibrations on LO generation circuitry 1300.

Low-IF conversion circuitry 1060 receives the in-phase (I) and quadrature (Q) signals 1160 and outputs real and imaginary digital signals, as represented by signals 1200. The low-IF conversion circuitry 1060 preferably includes band-pass or low-pass analog-to-digital converter (ADC) circuitry that converts the low-IF input signals to the digital domain. And the low-IF conversion circuitry 1060 provides, in part, analog-to-digital conversion, signal gain and signal filtering functions. Further digital filtering and digital processing circuitry with the digital signal processing (DSP) circuitry 1080 is then used to further tune and extract the signal information from the digital signals 1200. The DSP circuitry 1080 then produces baseband digital output signals 1220. When the input signals relate to FM broadcasts, this digital processing provided by the DSP circuitry 1080 can include, for example, FM demodulation and stereo decoding. Digital output signals 1220 can be left (L) and right (R) digital audio output signals 1220 that represent the content of the FM broadcast channel being tuned, as depicted in the embodiment 1000 of FIG. 10. It is noted that the output of the receiver 1000 can be other desired signals, including, for example, low-IF quadrature I/Q signals from an analog-to-digital converter that are passed through a decimation filter, a baseband signal that has not yet been demodulated, multiplexed L+R and L−R audio signals, L and R analog audio signals, and/or any other desired output signals.

It is noted that as used herein low-IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low-IF frequency for FM broadcasts within the United States would be an IF frequency equal to or below about 600 kHz. It is further noted that for spectrums with non-uniform channel spacings, a low-IF frequency would be equal to or below about three steps in the channel tuning resolution of the receiver circuitry. For example, if the receiver circuitry were configured to tune channels that are at least about 100 kHz apart, a low-IF frequency would be equal to or below about 300 kHz. As noted above, the IF frequency may be fixed at a particular frequency or may vary within a low-IF range of frequencies, depending upon the LO generation circuitry 130 utilized and how it is controlled. In other embodiments, other types of down conversion from RF signals to baseband may be effected.

It is further noted that the architecture of the present invention can be utilized for receiving signals in a wide variety of signal bands, including AM audio broadcasts, FM audio broadcasts, television audio broadcasts, weather channels, television signals, satellite radio signals, global positioning signals (GPS), and other desired broadcasts, among many other signal types.

In some embodiments receiver 1000 may be implemented in a portable device. While different implementations are possible, it is noted that a portable device may preferably be a small portable device. For example, the portable device could be a cellular phone, an MP3 player, a PC card for a portable computer, a USB connected device or any other small portable device having an integrated receiver.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   determining a frequency range corresponding to a least significant bit (LSB) of a first control word that controls a first capacitor bank of a controlled oscillator by applying an arbitrary value of the first control word to the first capacitor bank and measuring a first frequency of the controlled oscillator, adjusting the LSB of the arbitrary value of the first control word, and applying the adjusted first control word to the first capacitor bank and measuring a second frequency of the controlled oscillator, wherein the difference between the first and second frequencies corresponds to the frequency range;
   measuring a measured value of a second control word that controls a second capacitor bank of the controlled oscillator at which the second capacitor bank provides a capacitance value substantially corresponding to the frequency range by applying a first value of the second control word to the second capacitor bank, measuring a frequency of the controlled oscillator, wherein the capacitance value substantially corresponds to the frequency range if the measured frequency is greater than the second frequency, and otherwise iteratively adjusting the LSB of the first value, applying the adjusted first value, and measuring the frequency until the measured frequency substantially corresponds to the frequency range; and
   storing the measured value of the second control word.

2. The method of claim 1, further comprising adjusting a frequency of the controlled oscillator using the measured value of the second control word when a limit of the second capacitor bank is reached.

3. The method of claim 2, wherein adjusting the frequency comprises:
   adjusting the LSB of the first control word in a first direction; and
   adjusting a value of the second capacitor bank in a second direction based on the measured value.

4. The method of claim 1 wherein the first capacitor bank comprises a coarse bank having a first weighting scheme, and the second capacitor bank comprises a fine bank having a second weighting scheme.

5. The method of claim 4 wherein at least the second capacitor bank includes at least one capacitor branch formed of a first capacitor coupled between an input node and a divider node, a second capacitor coupled between the divider node and a reference potential, and a third capacitor switchably coupled between the divider node and the reference potential 6. The method of claim 5 further comprising switchably coupling the third capacitor between the divider node and the reference potential via a bit of the second control word.

7. The method of claim 1, further comprising performing the method in a controller formed on a single substrate with the controlled oscillator.

8. A method comprising:
   applying an arbitrary value of a first control word that controls a first capacitor bank of a controlled oscillator to the first capacitor bank and measuring a first frequency of the controlled oscillator;
   adjusting a least significant bit (LSB) of the first control word, applying the adjusted first control word to the first capacitor bank and measuring a second frequency of the controlled oscillator;
   determining a frequency range corresponding to the LSB of the first control word based on a difference between the first frequency and the second frequency;
   applying the arbitrary value of the first control word to the first capacitor bank;
   iteratively adjusting a LSB of a second control word that controls a second capacitor bank of the controlled oscillator, incrementing a count, and measuring a third frequency of the controlled oscillator until the third frequency is greater than the second frequency; and
   setting a calibration value for the controlled oscillator corresponding to the count when the third frequency is greater than the second frequency.

9. The method of claim 8, wherein the calibration value corresponds to a value of the second control word corresponding to the frequency range of the LSB of the first control word.

10. The method of claim 9, further comprising storing the calibration value in a non-volatile memory and using the calibration value to fine tune the controlled oscillator to a desired frequency.

11. A system comprising:
   a controlled oscillator to generate a mixing signal for a mixer that receives a radio frequency (RF) signal and provides an intermediate frequency (IF) signal according to the mixing signal, the controlled oscillator including:
     a load capacitor formed of a first capacitor bank and a second capacitor bank, the first capacitor bank and the second capacitor bank having different weighting schemes; and
     a controller to control the load capacitor, wherein the controller is to determine a frequency range corresponding to a least significant bit (LSB) of a first control word that controls the first capacitor bank by applying an arbitrary value of the first control word to the first capacitor bank and measure a first frequency of the controlled oscillator, adjust the LSB of the arbitrary value of the first control word, and apply the adjusted first control word to the first capacitor bank and measure a second frequency of the controlled oscillator, wherein the difference between the first and second frequencies corresponds to the frequency range, measure a measured value of a second control word that controls the second capacitor bank at which the second capacitor bank provides a capacitance value substantially corresponding to the frequency range by applying a first value of the second control word to the second capacitor bank, measure a frequency of the controlled oscillator, wherein the capacitance value substantially corresponds to the frequency range if the measured frequency is greater than the second frequency, and otherwise iteratively adjust the LSB of the first value, apply the adjusted first value, and measure the frequency until the measured frequency substantially corresponds to the frequency range, and store the measured value of the second control word.

* * * * *